[19] United States Patent
Ahn

(10) Patent No.: US 8,941,154 B2
(45) Date of Patent: Jan. 27, 2015

(54) NON-VOLATILE MEMORY DEVICE AND METHOD FOR FABRICATING THE SAME

(75) Inventor: Jung-Ryul Ahn, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 494 days.

(21) Appl. No.: 13/243,556

(22) Filed: Sep. 23, 2011

(65) Prior Publication Data

US 2012/0168831 A1    Jul. 5, 2012

(30) Foreign Application Priority Data

Dec. 30, 2010 (KR) .................. 10-2010-0138806

(51) Int. Cl.
*H01L 29/94* (2006.01)
*H01L 27/115* (2006.01)
*H01L 29/792* (2006.01)

(52) U.S. Cl.
CPC ...... *H01L 27/11582* (2013.01); *H01L 29/7926* (2013.01)
USPC .......................... 257/288; 257/296; 257/390

(58) Field of Classification Search
CPC ................. H01L 27/110897; H01L 27/11526; H01L 27/115297
USPC ......................... 257/288, 296, 390
See application file for complete search history.

(56) References Cited

U.S. PATENT DOCUMENTS

| 7,186,617 | B2 * | 3/2007 | Lee et al. | 438/266 |
| 8,415,742 | B2 * | 4/2013 | Kim et al. | 257/347 |
| 2008/0079091 | A1 * | 4/2008 | Park et al. | 257/390 |

FOREIGN PATENT DOCUMENTS

| JP | 2009224633 A | 10/2009 |
| JP | 2010098067 A | 4/2010 |
| KR | 1020070000664 A | 1/2007 |

OTHER PUBLICATIONS

Megumi Ishiduki, Optimal Device Structure for Pipe-shaped BiCS Flash Memory for Ultra High Density Storage Device with Excellent Performance and Reliability, IEEE, 2009, 625-628, IEDM09.
Jaehoon Jang, Vertical Cell Array using TCAT (Terabit Cell Array Transistor) Technology for Ultra High Density NAND Flash Memory, 2009 Symposium on VLSI Technology Digest of Technical Papers, 2009, 192-193.
Soon-Moon Jung, Three Dimensionally Stacked NAND Flash Memory Technology Using Stacking Single Crystal Si Layers on ILD and TANOS Structure for Beyond 30nm Node.
H. Tanaka, Bit Cost Scalable Technology with Punch and Plug Process for Ultra High Density Flash Memory, 2007 Symposium on VLSI Technology Digest of Technical Papers, 2007, 14-15.

* cited by examiner

*Primary Examiner* — Matthew E Warren
(74) *Attorney, Agent, or Firm* — William Park & Associates Patent Ltd.

(57) ABSTRACT

A method for fabricating a non-volatile memory device includes: providing a substrate which includes a cell region where a plurality of memory cells are to be formed and a peripheral circuit region where a plurality of peripheral circuit devices are to be formed; forming the memory cells that are stacked perpendicularly to the substrate of the cell region; and forming a first conductive layer for forming a gate electrode of a selection transistor over the memory cells while forming the first conductive layer in the peripheral circuit region simultaneously, wherein the first conductive layer of the peripheral circuit region functions as a resistor body of at least one peripheral circuit device of the peripheral circuit devices.

7 Claims, 11 Drawing Sheets

CELL REGION | PERIPHERAL CIRCUIT REGION

CELL REGION | PERIPHERAL CIRCUIT REGION

NON-VOLATILE MEMORY DEVICE AND METHOD FOR FABRICATING THE SAME

CROSS-REFERENCE TO RELATED APPLICATIONS

The present application claims priority of Korean Patent Application No. 10-2010-0138806, filed on Dec. 30, 2010, which is incorporated herein by reference in its entirety.

BACKGROUND

1. Field

Exemplary embodiments of the present invention relate generally to a memory device and a method for fabricating the same, and more particularly, to a non-volatile memory device in which memory cells are stacked over a substrate and a method for fabricating the same.

2. Description of the Related Art

Non-volatile memory devices such as flash memories retain the stored data even when the power supply is cut off.

A non-volatile memory device includes a cell region having the memory cells and a peripheral circuit region having diverse circuits of unit elements needed to perform the operations for accessing the memory cells.

Memory cells in a cell region have a stacked structure of tunnel insulation layer, a floating gate, a charge blocking layer, and a control gate.

The diverse circuits in the peripheral circuit region include various unit elements such as transistors, capacitors, resistors, etc. For example, a voltage dividing circuit as shown in FIG. 1 which includes at least one resistor may be disposed in the peripheral circuit region.

FIG. 1 illustrates a conventional voltage dividing circuit.

Referring to FIG. 1, a voltage applying circuit 110 outputs a predetermined voltage, e.g., high voltage VPP, to the first output node D1. A voltage dividing circuit 120 formed of serially connected first and second resistors R1, R2 at a second output node D2 divides the high voltage VPP provided to the first output node D1. The first resistor R1 is coupled between the first output node D1 and a second output node D2, and the second resistor R2 is coupled between the second output node D2 and a ground. The first resistor R1 and the second resistor R2 divide the high voltage VPP applied to the first output node D1 based on the resistance ratio of R1 and R2 and output dividend voltages VPPI to the second output node D2.

Therefore, in order to form a voltage dividing circuit in the peripheral circuit region, a resistor body needs to be formed over a portion of the substrate in the peripheral circuit region. The resistor body for voltage division is referred to as "a voltage dividing resistor body," hereafter.

Conventionally, a polysilicon layer is used as a voltage dividing resistor body. The polysilicon layer for use as a voltage dividing resistor body is formed when forming a polysilicon layer for a floating gate in a cell region, or when forming a polysilicon layer for a lower layer of a control gate in a cell region.

However, when a voltage dividing resistor body is formed nearer the substrate together with a lower structure element such as a floating gate or a control gate, the resistance of the voltage dividing resistor body changes greatly. This is due to the changes in the impurity doping concentration of the polysilicon layer as a result of performing many diverse subsequent processes such as a thermal treatment or an etch process.

In a two dimensional memory device, memory cells are formed over a silicon substrate in a single layer. To overcome the technical limitations associated with further improving the level of high integration in a two-dimensional memory device, a non-volatile memory device having a three-dimensional structure in which a plurality of memory cells are stacked perpendicularly to a silicon substrate has been proposed.

FIG. 2 is a cross-sectional view illustrating a typical three-dimensional structure in a non-volatile memory device.

Referring to FIG. 2, the conventional three-dimensional non-volatile memory device includes a lower selection transistor (LOWER ST), a plurality of memory cells (MC), and an upper selection transistor (UPPER ST).

The lower selection transistor LOWER ST and the upper selection transistor UPPER ST correspond to a drain selection transistor (or a source selection transistor) and a source selection transistor (or a drain selection transistor) of a conventional two-dimensional non-volatile memory device, respectively, and they are selection transistors for selecting a target page PAGE during a program/read operation of the non-volatile memory device. Each of the lower selection transistor LOWER ST and the upper selection transistor UPPER ST includes a channel layer 14 protruded vertically to a substrate 10, a gate electrode-forming conductive layer 12 disposed on the sidewalls of the channel layer 14, and a gate insulation layer 13 disposed between the channel layer 14 and the gate electrode-forming conductive layer 12.

A plurality of memory cells MC is stacked vertically between the lower selection transistor LOWER ST and the upper selection transistor UPPER ST. The memory cells MC include the channel layer 14 protruded vertically to the substrate 10, a structure disposed on the sidewalls of the channel layer 14 and including the gate electrode-forming conductive layer 12 and an inter-layer dielectric layer 11 alternately stacked, and a charge blocking layer 15, a charge trapping layer 16 and a tunnel insulation layer 17 disposed between the stacked structure and the channel layer 14.

The three-dimensional non-volatile memory device also requires a resistor body such as a voltage dividing resistor body to be formed in a peripheral circuit region.

SUMMARY

An embodiment of the present invention is directed to a non-volatile memory device which allows higher degree of integration by stacking a plurality of memory cells vertically, decrease a resistance change of a voltage dividing resistor body formed in a peripheral circuit region, decrease the area occupied by the voltage dividing resistor body, and simplify a device fabrication process, and a method for fabricating the same.

A method of fabricating a non-volatile memory device in accordance with an embodiment of the present invention includes: providing a substrate which includes a cell region where a plurality of memory cells are to be formed and a peripheral circuit region where a plurality of peripheral circuit devices are to be formed; forming the memory cells that are stacked perpendicularly to the substrate of the cell region; and forming a first conductive layer for forming a gate electrode of a selection transistor over the memory cells while forming the first conductive layer in the peripheral circuit region simultaneously, wherein the first conductive layer of the peripheral circuit region functions as a resistor body of at least one peripheral circuit device of the peripheral circuit devices.

A non-volatile memory device in accordance with an embodiment of the present invention includes: a substrate configured to include a cell region where a plurality of memory cells are to be formed and a peripheral circuit region where a plurality of peripheral circuit devices for forming peripheral circuits are to be formed; the memory cells that are stacked perpendicularly to the substrate of the cell region; a gate electrode of a selection transistor formed over the memory cells; and a conductive layer pattern disposed in the peripheral circuit region and formed of the same material as the gate electrode, wherein the conductive layer pattern functions as a resistor body of at least one peripheral circuit device of the peripheral circuit devices.

DETAILED DESCRIPTION

Figure 1:
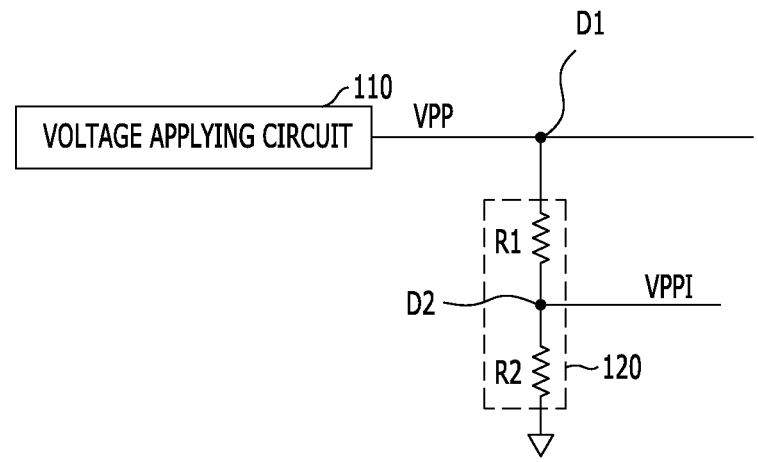
FIG. 1 illustrates a conventional voltage dividing circuit.
Figure 2:
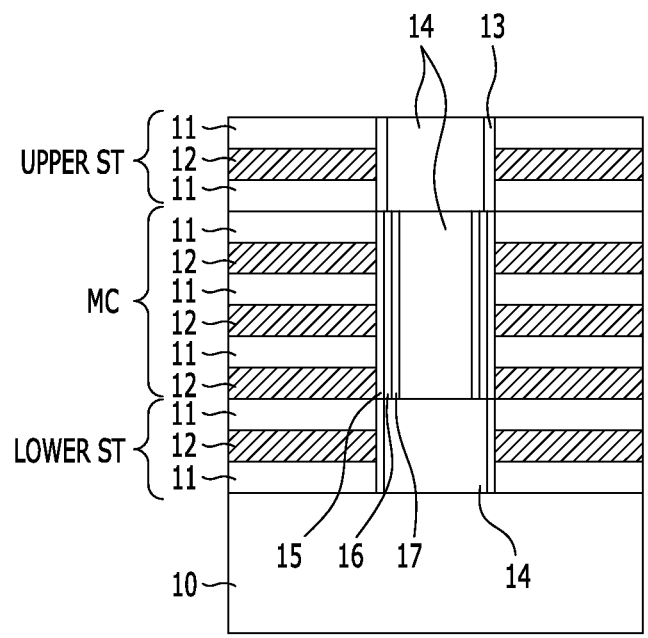
FIG. 2 is a cross-sectional view illustrating a non-volatile memory device having a three-dimensional structure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereafter, a non-volatile memory device having a three-dimensional structure in accordance with a first embodiment of the present invention and a fabrication method thereof are described with reference to FIGS. 3A-3C to 4A-4E.

Figure 3A:
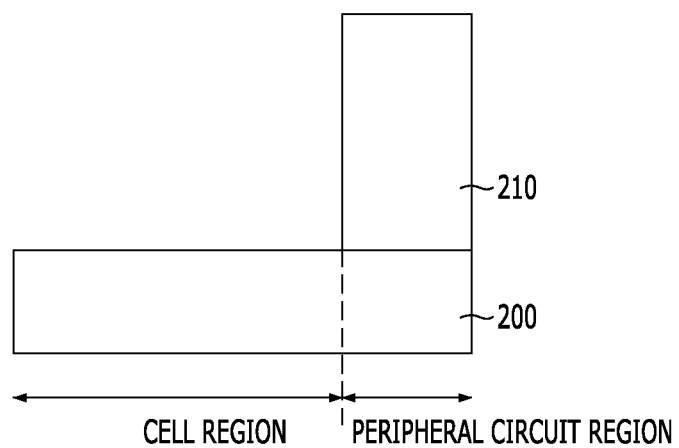
FIGS. 3A to 3C are cross-sectional views illustrating a method of fabricating a non-volatile memory device in accordance with a first embodiment of the present invention.
Figure 3B:
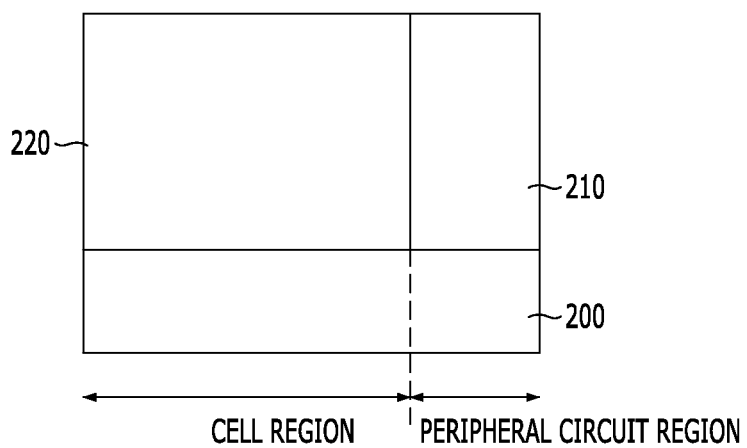
Figure 3C:
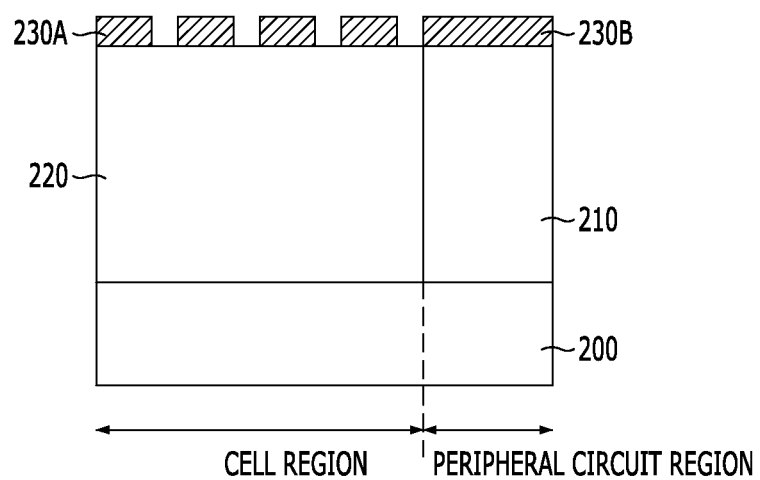

FIGS. 3A to 3C are cross-sectional views for conceptually illustrating a method for fabricating a non-volatile memory device in accordance with an embodiment of the present invention. FIGS. 4A to 4E are cross-sectional views for describing the method of FIGS. 3A to 3C in detail. The non-volatile memory device in accordance with an embodiment of the present invention will be described later with reference to FIGS. 3C and 4E.

Referring to FIG. 3A, a substrate 200 includes a cell region and a peripheral circuit region.

A cell region is where a memory cell is to be formed. In an embodiment of the present invention, a plurality of memory cells as layers stacked in a vertical direction may be formed over the cell region of the substrate 200.

A peripheral circuit region is where various circuits formed of various unit elements such as transistor, capacitor, resistor, and the like are formed for performing memory cell access operations. The diverse and various circuits formed in the peripheral circuit region are referred to as the "peripheral circuits," and the unit elements constituting a peripheral circuit are referred to as the "peripheral circuit devices."

In an embodiment, a voltage dividing circuit is one of the peripheral circuits that can be formed in the peripheral circuit region, and, in forming the voltage dividing circuit, a conductive layer functioning as a voltage dividing resistor body may be formed in the peripheral circuit region.

Also a voltage applying circuit for outputting a predetermined voltage to the voltage dividing circuit is one of the peripheral circuits that may be formed in the peripheral circuit region, and the diverse peripheral circuit devices constituting the voltage applying circuit such as a transistor, a capacitor, and the like may be formed in the peripheral circuit region for the voltage applying circuit.

Now referring to FIG. 3A, a peripheral circuit portion 210 is formed over the peripheral circuit region of the substrate 200. The peripheral circuit portion 210 may include diverse peripheral circuits, such as a voltage applying circuit which outputs a predetermined voltage. The formation of the peripheral circuit portion 210 including a voltage applying circuit is described in detail with reference to FIG. 4A.

Figure 4A:
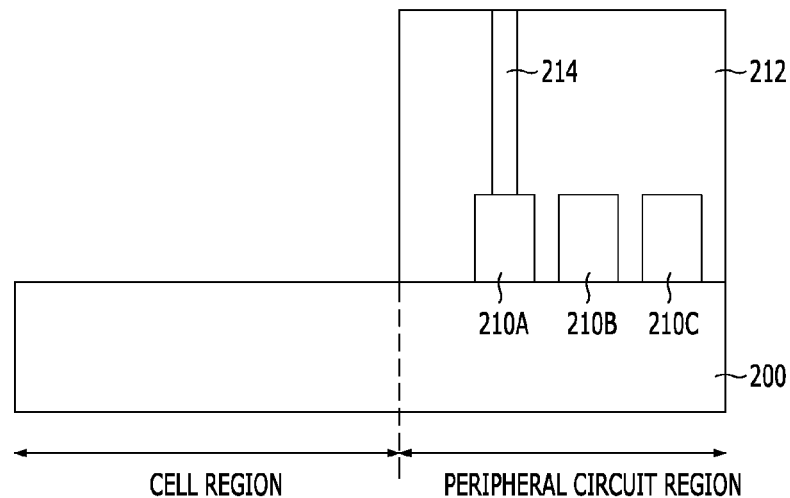
FIGS. 4A to 4E are cross-sectional views for describing the method of FIGS. 3A to 3C in detail.

Referring to FIG. 4A, a plurality of peripheral circuit devices such as 210A, 210B, and 210C for forming diverse peripheral circuits included in the peripheral circuit portion 210 (FIG. 3A) are formed over the peripheral circuit region of the substrate 200. Subsequently, an insulation layer 212 is formed to cover the first to third peripheral circuit devices 210A, 210B, and 210C for a subsequent process, and a contact 214 is formed through the insulation layer 212 to electrically connect to the first peripheral circuit device 210A.

The peripheral circuit devices 210A, 210B, and 210C are shown as square boxes in FIG. 4A to symbolically represent that they may be of various different types of circuit devices such as, but not limited to, a transistor, a capacitor, a resistor body, etc. FIG. 4A shows the first to third peripheral circuit devices 210A, 210B, and 210C formed in a same layer, but the scope of the present invention is not limited thereto. That is, to form a peripheral circuit over a substrate according to an embodiment of the present invention, many of the diverse peripheral circuit devices may be disposed in any number of different layers.

When the peripheral circuit portion 210 (FIG. 3A) includes a voltage applying circuit for outputting a predetermined voltage, the first peripheral circuit device 210A may be one of the constituent element of the voltage applying circuit, and one node of the first peripheral circuit device 210A may correspond to an output node of the voltage applying circuit. A voltage dividing resistor body may be formed by forming a conductive layer over the insulation layer 212 to electrically connect to one node of the first peripheral circuit device 210A through the contact 214. This is described in detail below when the related portion is described.

Referring to FIG. 3B, a memory cell portion 220 is formed over a cell region of the substrate 200. In an embodiment of the present invention, the memory cell portion 220 may include a plurality of memory cells that are stacked over (for example, perpendicular to) the cell region of the substrate 200 so as to improve the degree of high integration of the non-volatile memory device. An exmaple formation of the memory cell portion 220 is described in detail in FIG. 4B.

Figure 4B:
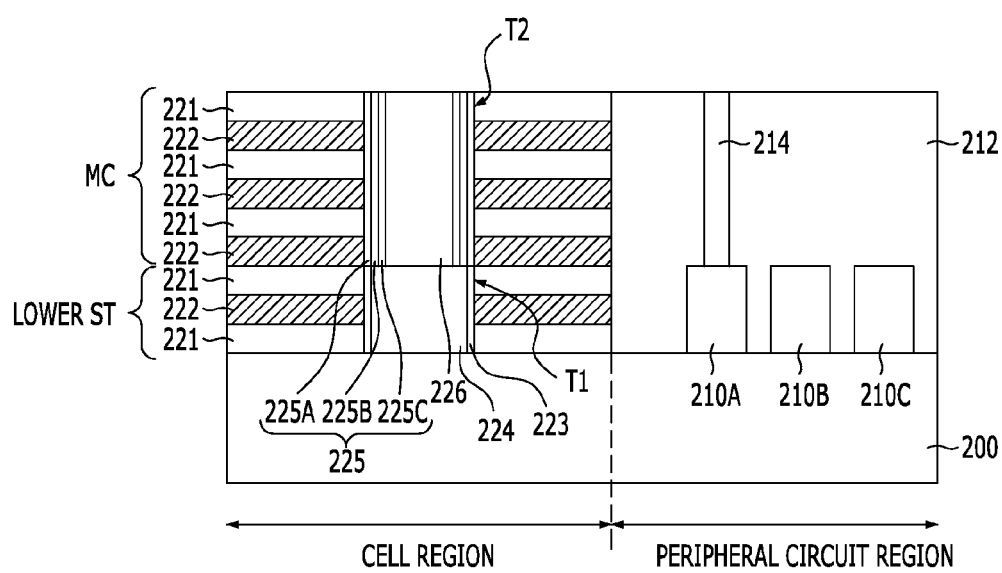

Referring to FIG. 4B, a stacked structure comprising a lower selection transistor and a plurality of memory cells is formed over the cell region of the substrate 200. A required lower structure (not shown) such as a source line may be formed in the cell region of the substrate 200.

Forming a lower selection transistor LOWER ST over the cell region of the substrate 200 is described with reference to FIG. 4B. An inter-layer dielectric layer 221, a gate electrode-forming conductive layer 222, and an inter-layer dielectric layer 221 are sequentially formed over the cell region of the substrate 200. A first trench T1 is formed to expose the substrate 200 by patterning the inter-layer dielectric layer 221, the gate electrode-forming conductive layer 222, and the inter-layer dielectric layer 221. Then a gate insulation layer 223 is formed on the internal wall of the first trench T1. A channel layer 224 is filled inside the first trench T1 having the internal wall of the gate insulation layer 223. The inter-layer dielectric layer 221 may be an oxide layer or a nitride layer; the gate electrode-forming conductive layer 222 may be a polysilicon layer doped with an impurity; and the channel layer 224 may be a polysilicon layer doped with an impurity.

Forming a plurality of memory cells MC stacked over the lower selection transistor LOWER ST is described below in reference to FIG. 4B. The inter-layer dielectric layer 221 and the gate electrode-forming conductive layer 222 are alternately formed over the substrate structure having the lower selection transistor LOWER ST formed therein. A second trench T2 is formed to expose the channel layer 224 of the lower selection transistor by patterning the inter-layer dielectric layer 221 and the gate electrode-forming conductive layer 222 that are stacked alternately. Subsequently, a charge blocking layer 225A, a charge trapping layer 225B, and a tunnel insulation layer 225C are sequentially formed on the internal wall of the second trench T2. Hereafter, the charge blocking layer 225A, the charge trapping layer 225B, and the tunnel insulation layer 225C are collectively referred to as a memory gate insulation layer 225. A channel layer 226 is filled inside the second trench T2 having the internal wall of the memory gate insulation layer 225. The charge blocking layer 225A, the charge trapping layer 225B, and the tunnel insulation layer 225C may be an oxide layer, a nitride layer, and an oxide layer, respectively. The channel layer 226 may be a polysilicon layer doped with an impurity.

FIGS. 3B and 4B illustrate the memory cell portion 220 including the lower selection transistor LOWER ST and a plurality of memory cells MC, but does not show an upper selection transistor as it will be described more in detail below.

Referring to FIG. 3C, a gate electrode 230A of an upper selection transistor and a conductive layer pattern 230B are formed respectively over the cell region and the peripheral circuit region of the substrate 200 at the time. The conductive layer pattern 230B functions as a voltage dividing resistor body. The gate electrode 230A and the conductive layer pattern 230B may be formed by forming a conductive layer over the memory cell portion 220 and the peripheral circuit portion 210 and patterning the conductive layer. In other words, the conductive layer pattern 230B is formed using the same conductive layer formed for forming the gate electrode 230A. The conductive layer for forming the gate electrode 230A and the conductive layer pattern 230B may include polysilicon doped with an impurity. The formation of gate electrode 230A and the conductive layer pattern 230B in accordance with an embodiment of the present invention is described in detail hereinafter with reference to FIGS. 4C to 4E.

Figure 4C:
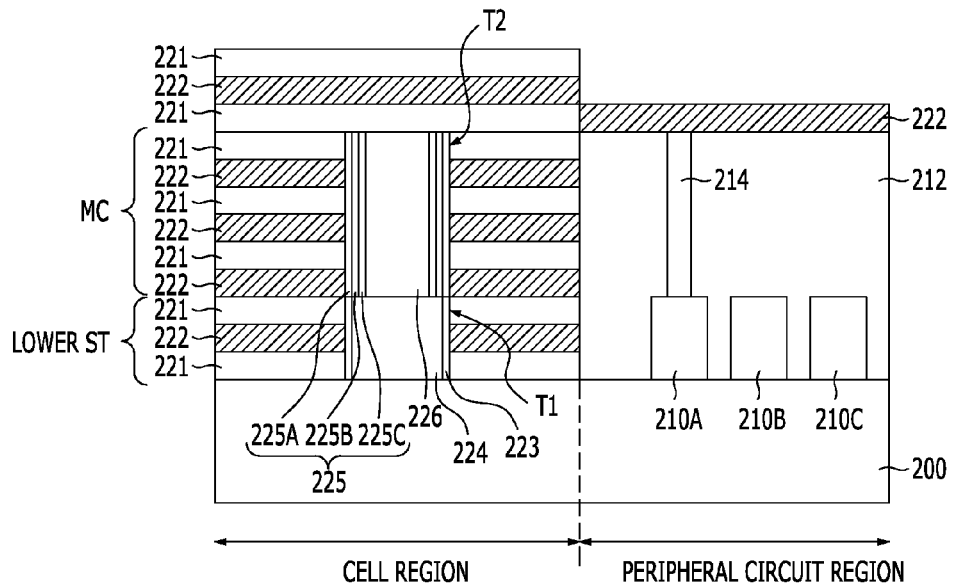

Referring to FIG. 4C, the inter-layer dielectric layer 221, the gate electrode-forming conductive layer 222, and the inter-layer dielectric layer 221 are sequentially formed over a plurality of memory cells MC of the cell region. Herein, the gate electrode-forming conductive layer 222 is formed in the peripheral circuit region as well while the gate electrode-forming conductive layer 222 is formed in the cell region. As a result, the gate electrode-forming conductive layer 222 is formed on the insulation layer 212 of the peripheral circuit region.

Figure 4D:
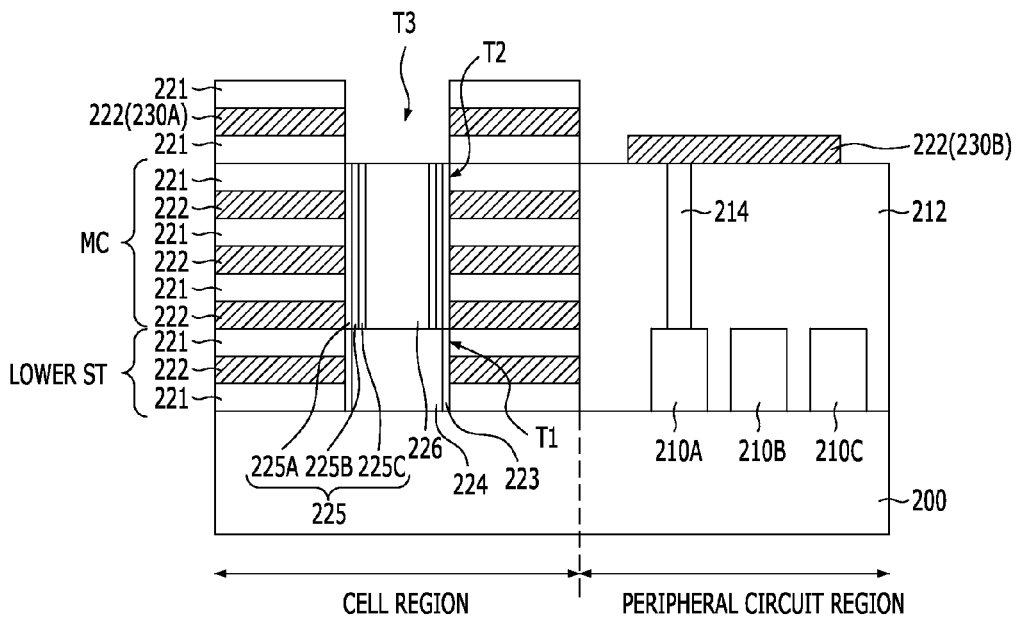

Referring to FIG. 4D, a third trench T3 is formed to expose the channel layer 226 of the memory cells MC by patterning the inter-layer dielectric layer 221, the gate electrode-forming conductive layer 222, and the inter-layer dielectric layer 221 of the cell region, and, at the same time, the gate electrode-forming conductive layer 222 of the peripheral circuit region is patterned.

As a result, the gate electrode-forming conductive layer 222 which is patterned in the cell region becomes a gate electrode (referred to as 230A in FIG. 3C) of the upper selection transistor, and the gate electrode-forming conductive layer 222, which is patterned in the peripheral circuit region, becomes a conductive layer pattern which functions as a voltage dividing resistor body (referred to as 230B in FIG. 3C).

In the drawings, the gate electrode-forming conductive layer 222 patterned in the peripheral circuit region may be electrically connected to the first peripheral circuit device 210A through the contact 214. As described before, when the first peripheral circuit device 210A is an element of the voltage applying circuit and when one node of the first peripheral circuit device 210A corresponds to an output node of the voltage applying circuit, the gate electrode-forming conductive layer 222 patterned in the peripheral circuit region may be electrically connected to the one node of the first peripheral circuit device 210A and divide an applied voltage. Although the drawings illustrate various embodiments of the present invention, it should be readily understood that the scope of the present invention is not limited just to those shown in the drawings. The gate electrode-forming conductive layer 222 patterned in the peripheral circuit region may be connected to diverse peripheral circuit devices in the peripheral circuit region and divide an applied voltage.

Also, as mentioned above, the conductive layer for forming the gate electrode 230A and the conductive layer pattern 230B may be a polysilicon layer doped with an impurity according to an embodiment of the invention, but it should also be readily understood the scope of the present invention is not limited by it. The conductive layer forming the gate electrode 230A and the conductive layer pattern 230B may be a polysilicon layer not doped with an impurity, and, in this case, an impurity may be implanted into the gate electrode 230A and the conductive layer pattern 230B through an ion implantation process after the gate electrode 230A and the conductive layer pattern 230B are formed.

Figure 4E:
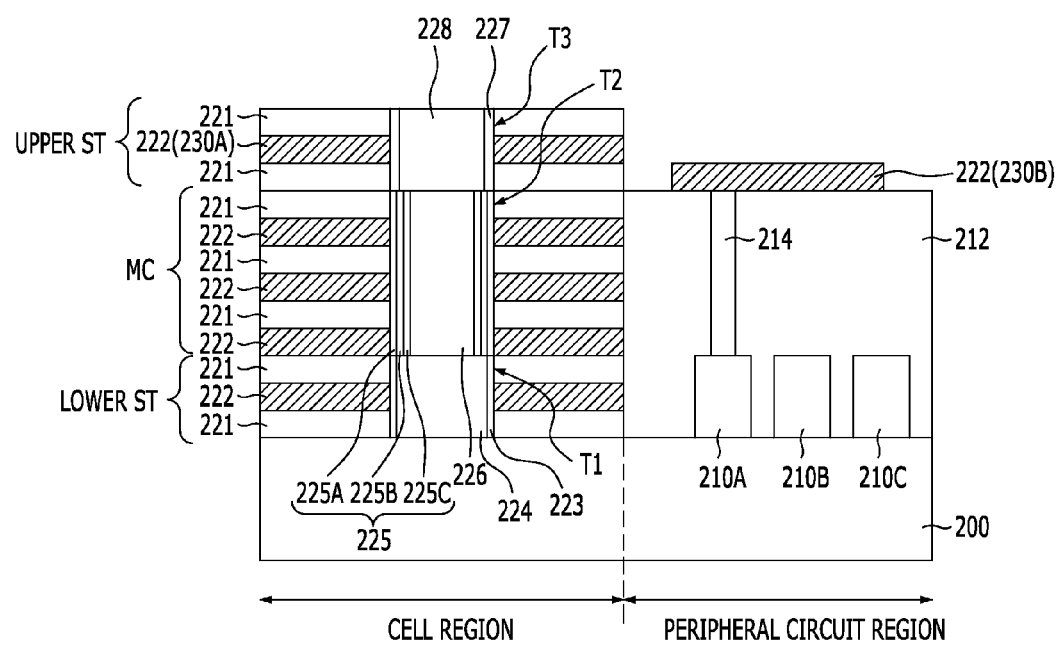

Referring to FIG. 4E, the upper selection transistor UPPER ST disposed over a plurality of memory cells MC is formed by forming a gate insulation layer 227 on the internal wall of the third trench T3, and then forming a channel layer 228 filling the third trench T3 with its internal wall formed with the gate insulation layer 227. The channel layer 228 may be a polysilicon layer doped with an impurity.

Hereafter, the structure of a non-volatile memory device in accordance an embodiment of the present invention is described with reference to FIGS. 3C and 4A-4E.

Referring to FIGS. 3C and 4A-4E, the non-volatile memory device in accordance with an embodiment of the present invention includes the substrate 200 having a cell region and a peripheral circuit region, the memory cell portion 220 and the peripheral circuit portion 210 formed in the cell region and the peripheral circuit region respectively, and the gate electrode 230A of the upper selection transistor and the conductive layer pattern 230B formed over the memory cell portion 220 and the peripheral circuit portion 210 respectively. The conductive layer pattern 230B is formed of the same material as the gate electrode 230A, e.g., polysilicon doped with an impurity or polysilicon not doped with an impurity, and functions as the voltage dividing resistor body.

The memory cell portion 220 includes a plurality of memory cells MC that are vertically stacked, and the lower selection transistor LOWER ST may be formed under the plurality of memory cells MC. The peripheral circuit portion 210 includes a plurality of peripheral circuit devices 210A, 210B, and 210C for forming peripheral circuits, and it may include the contact 214 for coupling at least any one among the peripheral circuit devices 210A, 210B, and 210C, for example, the first peripheral circuit device 210A, with the voltage dividing resistor body, and the insulation layer 212 having the contact 214.

According to an embodiment of the present invention directed to the non-volatile memory device and a fabrication method thereof, when a selection transistor is formed over the memory cells MC that are stacked vertically (more specifically, when a gate electrode of a selection transistor is formed together with a conductive layer which functions as a voltage dividing resistor body in the peripheral circuit region), there are many advantages, of which a few are discussed as follows.

The degree of high integration of the non-volatile memory device is increased even more by stacking the multiple memory cells in the vertical direction.

By forming the voltage dividing resistor body together with and at the same time of forming the upper selection transistor, which occurs relatively late in the process, the resistance variation of the voltage dividing resistor body, which could arise if it were not formed relatively late due to the subsequent process conditions, is decreased.

Also, since the voltage dividing resistor body is disposed in the vertical upper portion of the peripheral circuit portion 210, additional area for forming the voltage dividing resistor body is not required, which leads to a decrease in the size of the non-volatile memory device.

Furthermore, since the conductive layer which functions as the voltage dividing resistor body is formed and patterned together when the gate electrode of the upper selection transistor is formed, the fabrication process may be simplified.

Figure 5A:
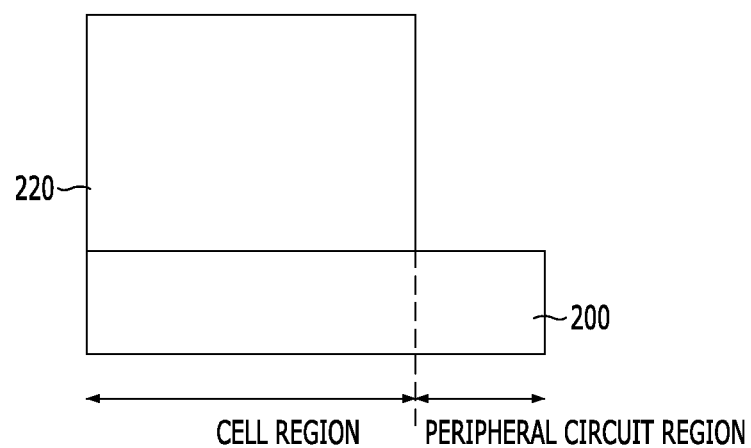
FIGS. 5A to 5C are cross-sectional views illustrating a method of fabricating a non-volatile memory device in accordance with an embodiment of the present invention.
Figure 5B:
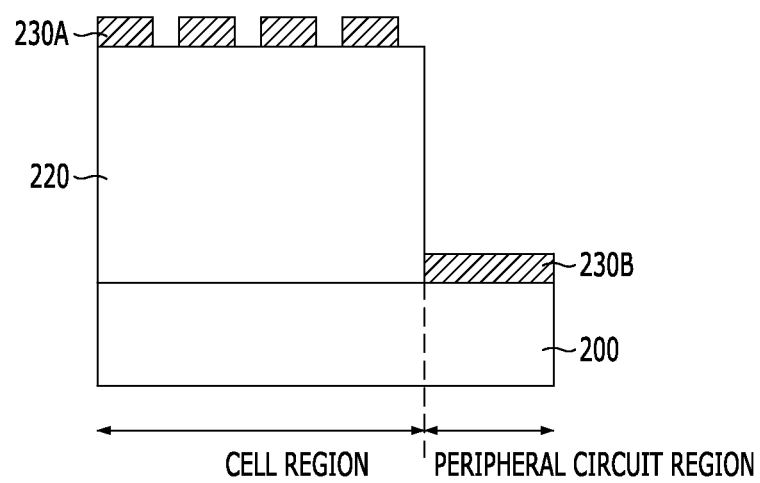
Figure 5C:
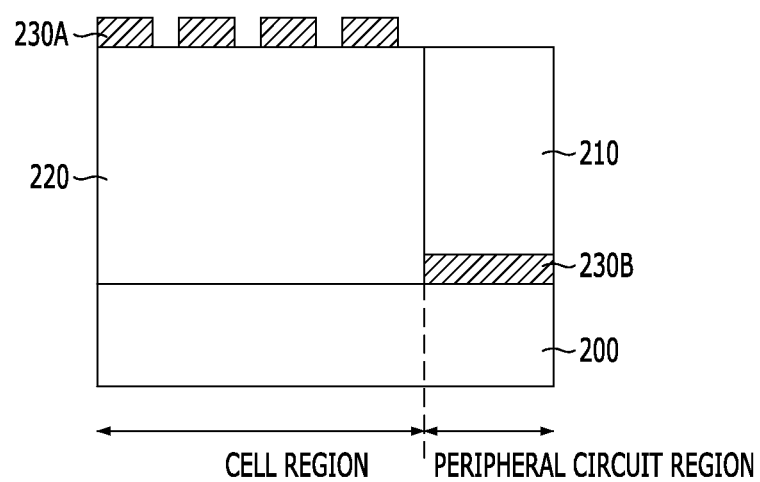

Hereafter, a non-volatile memory device having a three-dimensional structure and a fabrication method thereof in accordance an embodiment of the present invention are described with reference to FIGS. 5A-5C to 6A-6E. FIGS. 5A to 5C are cross-sectional views illustrating a method for fabricating a non-volatile memory device in accordance with an embodiment of the present invention. FIGS. 6A to 6E are cross-sectional views describing the method of FIGS. 5A to 5C in detail. In describing an embodiment of the present invention below, any portion that is substantially the same as or similar to those already described above may be omitted or made simple.

Referring to FIG. 5A, a substrate 200 includes a cell region and a peripheral circuit region.

Referring back to FIG. 3B, a memory cell portion 220 is formed over a cell region of the substrate 200. In an embodiment of the present invention shown in FIGS. 5A-5B, the memory cell portion 220 includes a plurality of memory cells that are stacked perpendicularly to the cell region of the substrate 200. The formation of the memory cell portion 220 is described in detail by taking an example with reference to FIG. 6A.

Figure 6A:
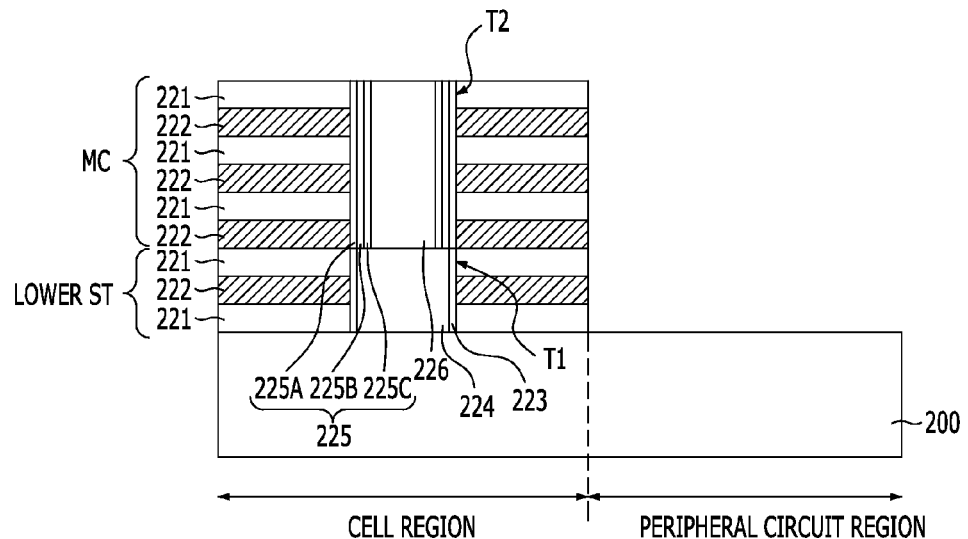
FIGS. 6A to 6E are cross-sectional views for describing the method of FIGS. 5A to 5C in detail.

Referring to FIG. 6A, a stacked structure where a lower selection transistor and a plurality of memory cells are stacked is formed over the cell region of the substrate 200. Certain lower structures (not shown) such as a source line may be formed in the substrate 200. In the same manner as described above, the stacked structure of the lower selection transistor LOWER ST and a plurality of memory cells MC are formed as shown in FIG. 6A.

Referring to FIG. 5B, a conductive layer pattern 230B, which functions as a voltage dividing resistor body, is formed over the substrate 200 of the peripheral circuit region, while a gate electrode 230A of an upper selection transistor is formed over the memory cell portion 220 of the cell region at the same time. The formation of gate electrode 230A and the conductive layer pattern 230B is described hereafter in detail with reference to FIGS. 6B to 6D.

Figure 6B:
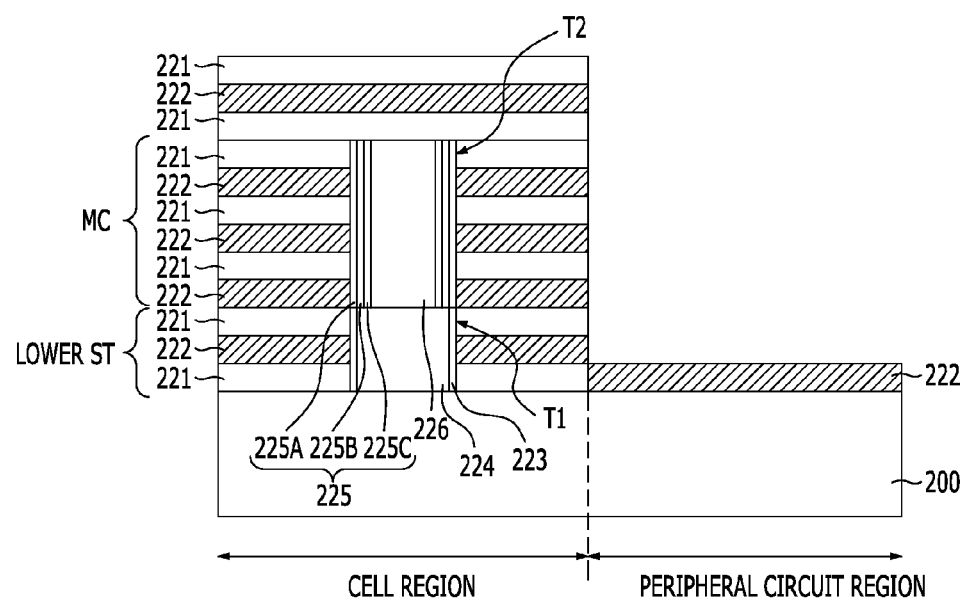

Referring to FIG. 6B, the inter-layer dielectric layer 221, the gate electrode-forming conductive layer 222, and the inter-layer dielectric layer 221 are sequentially formed over the plurality of memory cells MC of the cell region. Herein, the gate electrode-forming conductive layer 222 is formed in the peripheral circuit region as well while the gate electrode-forming conductive layer 222 is formed in the cell region. As a result, the gate electrode-forming conductive layer 222 is formed on the substrate 200 of the peripheral circuit region.

Figure 6C:
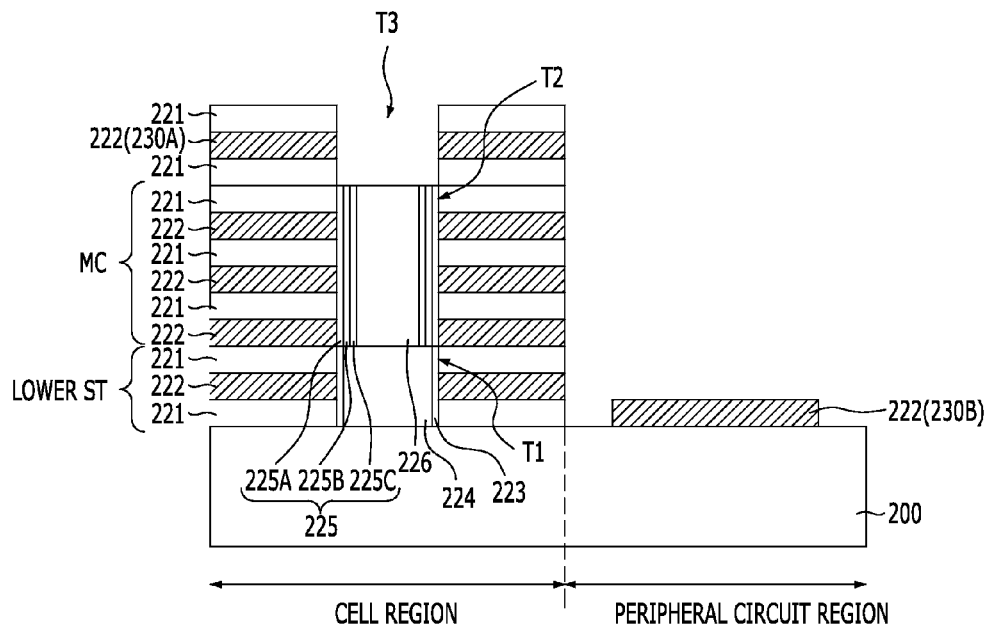

Referring to FIG. 6C, a third trench T3 is formed to expose the channel layer 226 of the plurality of memory cells MC by patterning the inter-layer dielectric layer 221, the gate electrode-forming conductive layer 222, and the inter-layer dielectric layer 221 of the cell region, and, at the same time, the gate electrode-forming conductive layer 222 of the peripheral circuit region is patterned.

As a result, the gate electrode-forming conductive layer 222 patterned in the cell region becomes a gate electrode (refer to as 230A in FIG. 5B) of the upper selection transistor, and the gate electrode-forming conductive layer 222 patterned in the peripheral circuit region becomes a conductive layer pattern, which functions as a voltage dividing resistor body (refer to as 230B in FIG. 5B).

Figure 6D:
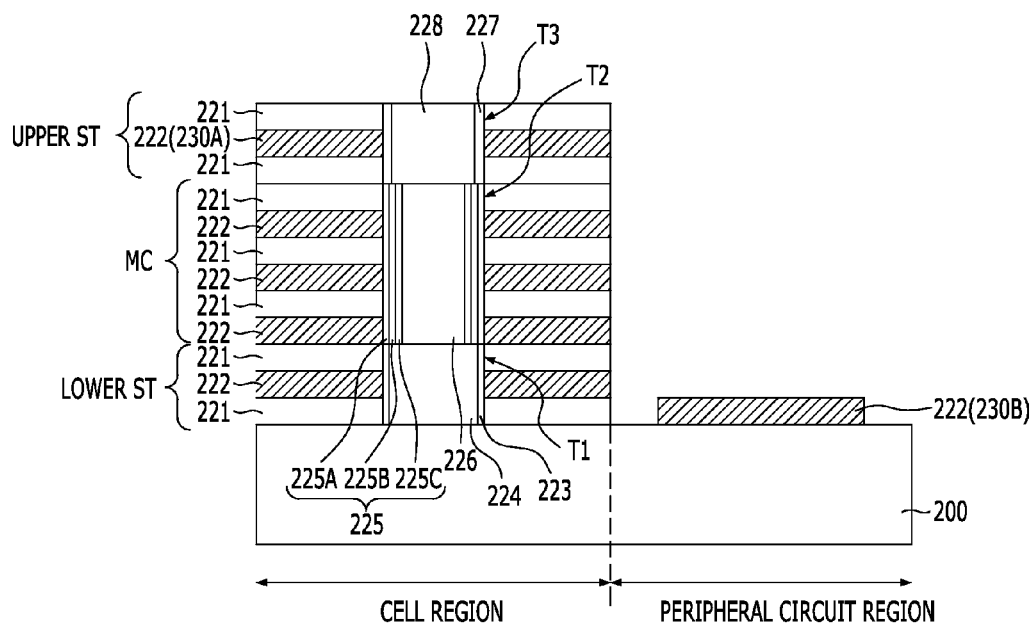

Referring to FIG. 6D, the upper selection transistor disposed over the plurality of memory cells MC is formed by forming a gate insulation layer 227 on the internal wall of the third trench T3, and by forming a channel layer 228 filled inside the third trench T3 have the internal wall formed with the gate insulation layer 227.

Referring to FIG. 5C, the peripheral circuit portion 210 is formed over the conductive layer pattern 230B in the peripheral circuit region of the substrate 200. Herein, the peripheral circuit portion 210 may include diverse peripheral circuits, such as a voltage applying circuit for outputting a predetermined voltage. The formation of the peripheral circuit portion 210 is described hereafter in detail with reference to FIG. 6E.

Figure 6E:
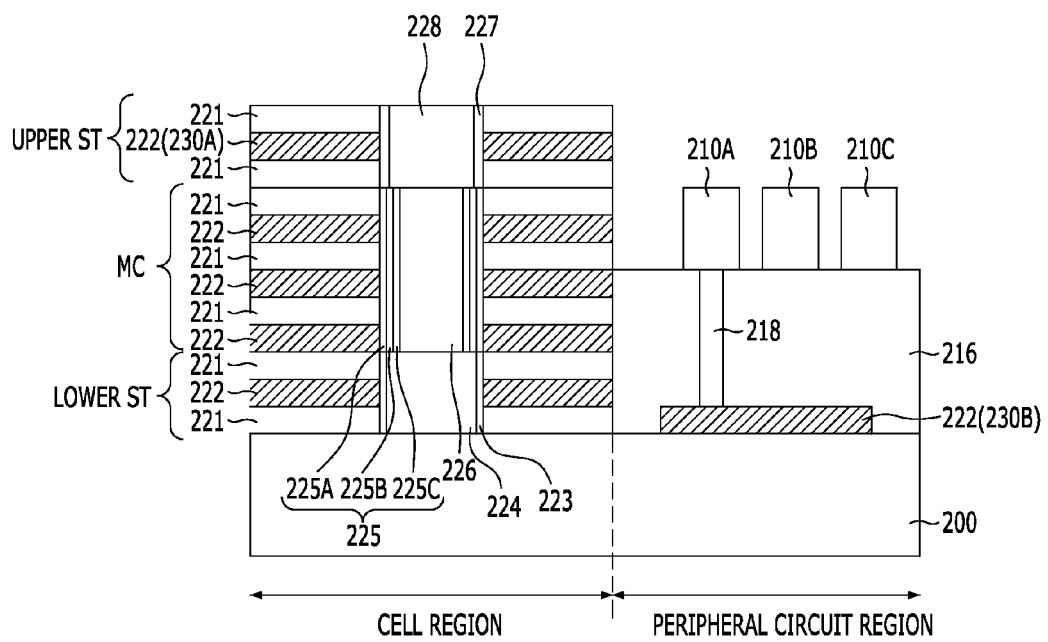

Referring to FIG. 6E, an insulation layer 216 covering the conductive layer pattern 230B is formed over the peripheral circuit region of the substrate 200, and a contact 218 is formed through the insulation layer 216 to electrically connect to the conductive layer pattern 230B.

Subsequently, a plurality of peripheral circuit devices for forming diverse peripheral circuits included in the peripheral circuit portion 210, for example, the first to third peripheral circuit devices 210A, 210B and 210C, are formed over the insulation layer 216 including the contact 218. Herein, the first peripheral circuit device 210A may be disposed over the contact 218 to be electrically connected to the conductive layer pattern 230B. When it is assumed that the peripheral circuit portion 210 includes a voltage applying circuit which outputs a predetermined voltage, and the first peripheral circuit device 210A is one of the constituent elements of the voltage applying circuit and one node of the first peripheral circuit device 210A corresponds to an output node of the voltage applying circuit, the conductive layer pattern 230B may function as a resistor body which is electrically connected to the one node of the first peripheral circuit device 210A through the contact 218 and divides an applied voltage.

Hereafter, the structure of a non-volatile memory device in accordance with an embodiment of the present invention is described with reference to FIGS. 5C and 6A-6E.

Referring to FIGS. 5C and 6A-6E, the non-volatile memory device in accordance with an embodiment of the present invention includes the substrate 200 having a cell region and a peripheral circuit region, the memory cell portion 220 formed in the cell region of the substrate 200, the gate electrode 230A of the upper selection transistor and the conductive layer pattern 230B that are respectively formed over the memory cell portion 220 and the substrate 200 of the peripheral circuit region, and the peripheral circuit portion 210 formed over the substrate 200 of the peripheral circuit region where the conductive layer pattern 230B is formed. Herein, the conductive layer pattern 230B is formed of the same material as the gate electrode 230A, e.g., polysilicon doped with an impurity, and functions as a voltage dividing resistor body.

An embodiment of the present invention with respect to FIGS. 5A-5C and 6A-6E may be similar to an embodiment of the present invention described above with respect to FIGS. 3A-3C and 4A-4E, but one notable difference among other differences is that, in FIG. 6E, the conductive layer pattern 230B as a voltage dividing resistor body is formed prior to the formation of the peripheral circuit portion 210, and, for this reason, the conductive layer pattern 230B is disposed under the peripheral circuit portion 210.

According to various embodiments of the device and fabrication method of the non-volatile memory of the present invention, it can realize a more highly integrated non-volatile memory device by stacking a plurality of memory cells MC vertically, and avoid undesirable resistance change of a voltage dividing resistor body formed in a peripheral circuit region, and decrease the area occupied by the voltage dividing resistor body. Furthermore, a device fabrication process may be simplified.

While the present invention has been described with respect to the specific embodiments, it will be apparent to those skilled in the art that various changes and modifications may be made without departing from the spirit and scope of the invention as defined in the following claims.

What is claimed is:

1. A memory device comprising a substrate having a cell region and a peripheral circuit region, comprising: first gate electrodes of a plurality of memory cells, the first gate electrodes are stacked over the cell region of the substrate so that the first gate electrodes are arranged in a vertical direction to the substrate; a second gate electrode of a selection transistor, the second gate electrode is formed over the first gate electrodes; a resistor body and a peripheral circuit device formed over the peripheral circuit region of the substrate, wherein the second gate electrode and the resistor body include a same material, and wherein the resistor body and the peripheral circuit device are disposed at different levels in the vertical direction.

2. The memory device of claim 1, wherein the peripheral circuit device is formed under the resistor body.

3. The memory device of claim 1, wherein the peripheral circuit device is formed over the resistor body.

4. The memory device of claim 2, further comprising: a contact electrically connecting the resistor body to the peripheral circuit device between the resistor body and the peripheral circuit device.

5. The memory device of claim 3, further comprising: a contact electrically connecting the resistor body to the peripheral circuit device between the resistor body and the peripheral circuit device.

6. The memory device of claim 1, wherein the resistor body and the peripheral circuit device overlap with each other in a plan view.

7. The memory device of claim 1, further comprising: a third gate electrode of another selection transistor, the third gate electrode is formed over the substrate and under the first gate electrodes.

* * * * *